United States Patent [19]

Hasegawa et al.

[11] Patent Number: 4,921,834
[45] Date of Patent: May 1, 1990

[54] FLUX METHOD OF GROWING OXIDE SUPERCONDUCTORS

[75] Inventors: Haruhiro Hasegawa, Kokubunji; Ushio Kawabe, Tokyo; Yoshinobu Tarutani, Yamanashi; Tokuumi Fukazawa, Tachikawa; Toshiyuki Aida, Chofu; Kazumasa Takagi, Tokyo, all of Japan

[73] Assignee: Hitachi, Ltd., Tokyo, Japan

[21] Appl. No.: 149,557

[22] Filed: Jan. 28, 1988

[30] Foreign Application Priority Data

Jan. 30, 1987 [JP] Japan .................................. 62-18392
Feb. 27, 1987 [JP] Japan .................................. 62-42559
Mar. 20, 1987 [JP] Japan .................................. 62-63782
Apr. 8, 1987 [JP] Japan .................................. 62-84740

[51] Int. Cl.$^5$ .......................... C30B 9/06; C01F 17/00
[52] U.S. Cl. ...................................... 505/1; 156/624; 156/622; 423/593; 505/729
[58] Field of Search ......................... 156/610–614, 156/624; 505/1, 729

[56] References Cited

U.S. PATENT DOCUMENTS 4,824,826 4/1989 Damento et al. ........................ 505/1

OTHER PUBLICATIONS

Laudise et al, Jour. Cry. Growth, 85 (1987), 569.
Hermann et al, Appl. Phys. Letts., 51 (Nov. 1987), 1854.
Hasegawa et al, Jap. Jour. Appl. Phys., 26 (May 1987), L-673.
Takekawa et al, Jap. Jour. Appl. Phys., 26 (May 1987), L-851.
Inoue et al, Jap. Jour. Appl. Phys., 26 (May 1987), L-732.
Damento et al, Appl. Phys. Letts., 51 (Aug. 1987), 690.
Takei et al, Jap. Jour. Appl. Phys., 26 (Sep. 1987), L-1425.

Primary Examiner—Upendra Roy
Attorney, Agent, or Firm—Antonelli, Terry & Wands

[57] ABSTRACT

An oxide-superconductor improved so as to have a high critical temperature ($T_c$) comprises an oxide having a $K_2NiF_4$ crystalline structure similar to a perovskite crystalline structure and represented by the following formula:

$$(Ba_xSr_zLa_{1-x-z})_2Cu_{1-w}Ag_wO_{4(1-y)}$$

wherein $0.1 < x+z < 0.3$, $w=0$, and $y \geq 0$; or $0 \leq x < 1$, $0 \leq z < 1$, $0 < w < 1$, and $y \geq 0$. This invention also relates to an oxide-superconductor wherein an Na, K, Rb, Cs or F atom is contained in an oxide-superconductor of $A_3Cu_3O_7$ type having at least one of a $CuO_6$ octahedron and a $CuO_5$ pentahedron. A single crystal of a composite oxide superconductor can be prepared by a flux method by making use of a starting material composed of a polycrystal of a composite oxide of an La-M-Cu oxide system or a Y-M-cu oxide system (wherein M is Sr, Ba, or Ca) or a mixture having a stoichiometric composition ratio similar to that of the constituent elements of said composite oxide and a flux comprised of CuO.

11 Claims, 7 Drawing Sheets

FLUX METHOD OF GROWING OXIDE SUPERCONDUCTORS

BACKGROUND OF THE INVENTION

1. Field of the Invention

This invention relates to a superconductor. More particularly, the present invention is concerned with an oxide-superconductor improved so as to have a high critical temperature ($T_c$) and a process for preparing the same.

2. Description of the Related Art

Oxide-superconducting materials having a perovskite crystalline structure or a $K_2NiF_4$ crystalline structure similar to the perovskite structure, i.e., $Ba_xLa_{5-x}$-$Cu_5O_{5(3-y)}$ (wherein $x=1$ or $0.75$ and $y>0$), were discussed in Z. Physik. B-Condened Matter 64, 189–193 (1986). Besides the above-described materials, among oxide superconducting materials having a perovskite crystalline structure, $SrTiO_3$ and $BaPb_{1-x}Bi_xO_3$ were discussed in Physical Review, Vol. 163, No. 2, Nov. 10, 380–390 (1967) and Appl. Phys. 22, 205–212 (1980), respectively.

Therefore, it was expected that beside these materials there would exist oxides having the above-described crystalline structure exhibiting superconductivity which were considered to be useful materials capable of constituting a superconductive device. However, the critical temperature, $T_c$, of the oxide superconducting material having a perovskite crystalline structure is as low as 35 K in the case of $Ba_xLa_{5-x}$-$Cu_5O_{5(3-y)}$ (wherein $x=0.75$ and $y>0$), and no materials exhibited superconductivity at a temperature exceeding this temperature.

Similarly, an oxide-superconductor having a high superconducting critical temperature, i.e. $(Sr,La)_2$-$CuO_4$, is discussed in Phys. Rev. Lett., 26, 408–410 (1987).

Moreover, a Y-Ba-Cu oxide system is known as a superconductor having a critical temperature, $T_c$, exceeding the liquid nitrogen temperature (77 K).

All the above-described superconductors have a structure obtained by modification of a perovskite structure which is relatively stable. Specifically, $(Sr,La)_2CuO_4$ has a $K_2NiF_4$ structure while the Y-Ba-Cu oxide system has a more complicated structure, i.e. an oxygen-deficient perovskite structure. $A_3B_2O_7$, $A_4B_3O_{10}$, $A_5B_4O_{13}$, and $A_6B_5O_{16}$ structures are considered to be further more complicate. In general, the more complicate the crystalline structure of the material, the more difficult the production of the material. Therefore, the difficulty in producing the above-described materials increases in order of the materials described above. This raised a problem that the difficulty in obtaining a homogeneous material would increase in order of the materials described above and the superconducting critical current density would decrease in that order. In general, the superconducting critical temperature of the oxide-superconductor characterized by possessing a $CuO_6$ octahedron like the above-described materials is higher when the crystalline structure is more complicate and the planes in which the c-axis is defined as the normal have higher two-dimensionality, i.e. an interaction between these planes are decreased. This is because an increase in the two-dimensionality brings about a shortening of the a-axis and a decrease in the distance between the Cu atom and the O atom within the plane. This causes an increase in the degree of overlapping between the 3d orbital of the Cu atom and the 2p orbital of the O atom, thus leading to an improvement in the conductivity of carriers within the plane. Therefore, the superconductors comprising the above-described materials have a high superconducting critical temperature. However, they have complicate crystalline structures, which leads to a problem that it is difficult to produce them.

In general, in the oxide-superconductors characterized by possessing a $CuO_6$ octahedron or a $CuO_5$ pentahedron like the above-described materials, the number of the carriers are determined by the composition ratio of the A site atoms, e.g. the composition ratio of Sr to La or that of Ba to Y in the case of the above-mentioned materials. Therefore, the electron density of state, $N(0)$, of the Fermi-surface is also determined by the composition ratio. According to the Bardeen-Cooper-Schrieffer theory (abbreviated to "BCS theory"), the superconducting critical temperature, $T_c$, is represented by the following equation:

$$k_BT_C=1.14h\omega_D\times \exp(-1/N(0)/V)$$

wherein $\omega_D$ is a Debye temperature and V a parameter representing the magnitude of the electron-phonon interaction. Therefore, in order to increase the superconducting critical temperature, $T_c$, it is necessary that the electron density of state, $N(0)$, of the Fermi-surface be large. For this reason, it is necessary to maximize the electron density of state, $N(0)$, of the Fermi-surface by changing the number of the carriers through proper change of the A site atoms. However, in the above-described materials, the parameter capable of changing the number of the carriers is only the composition ratio of the A site atoms, i.e. the composition ratio of Sr to La or that of Ba to Y, which leads to a problem that the number of the parameters is not sufficient to maximize the electron density of state, $N(0)$, of the Fermi-surface.

A composite oxide having a composition comprising a sesquioxide of lanthanum containing an alkaline earth metal (M) and a copper (Cu) ion which is represented by the formula $(La_{1-x}M_x)_2CuO_4$ (wherein M is Sr, Ba or Ca) has a nickel potassium fluoride ($K_2NiF_4$) crystalline structure. This is a crystal belonging to a tetragonal system (space group: $D_{4h}$-I4/mmm) and has a composite structure comprising a rock salt structure and a perovskite structure which are put on top of each other to form a multi-layer structure. On the other hand, a composite oxide of a Y-M-Cu oxide system (wherein M is Sr, Ba or Ca) comprising a sesquioxide of a rare earth element containing an alkaline earth metal (M) and a copper (Cu) ion has a perovskite-like crystalline structure. The rare earth element is present as an ion spacer between both structures, and the copper ion is within an oxygen octahedron. Therefore, this structure causes a difference in the characteristics in respect of electrical conductivity and electron emission between the direction of the c-axis and the plane normal to the c-axis, i.e. causes anisotropy. In recent years, it has been proved that a composite oxide prepared by replacing part of lanthanum with a small amount of an alkaline earth metal, such as barium or strontium, exhibited superconductivity at 30 to 40 K or a higher temperature, i.e. was a superconductor having a high critical temperature. In this kind of superconductor, there exists a difference by a factor of 10 in the coherence length of the superconductivity between the direction of the c-axis and the direction normal to the c-axis. Further, this composite oxide can contain barium and strontium as the constituent element, M, which can form monoatomic layers capable of reducing the work function on the surface thereof through combination with an oxidized atom, which also renders this composite oxide suitable as an electron emitting material.

However, the above-described material exhibits anisotropy because the monoatomic layers capable of reducing the work function are laminated in the direction of the c-axis. Therefore, a single crystal of this composite oxide is required in order to put this composite material to practical use as an electrically conductive material. This composite oxide comprises, e.g., $La_2O_3$, $Y_2O_3$ and CuO, BaO or SrO which tend to form a mixed phase when heated to around the melting point. Therefore, no excellent single crystal can be obtained by the crystal pulling method which requires the dissolution at a high temperature. Under these circumstances, hitherto, there have been proposed no process for preparing a composite single crystal which can be put to practical use.

SUMMARY OF THE INVENTION

The first object of the present invention is to provide an oxide-superconductor having a high critical temperature.

The second object of the present invention is to provide an oxide-superconductor which can be produced by a practical method with excellent reproducibility.

The third object of the present invention is to provide an oxide-superconductor which is easy to handle through mildening of cooling conditions.

The fourth object of the present invention is to provide an oxide-superconductor which has a stable crystalline structure and can be easily produced.

The fifth object of the present invention is to provide an oxide-superconductor having a high superconducting critical current density.

The sixth object of the present invention is to provide a process for preparing a single crystal of an oxide-superconductor having a high quality and an appropriate size.

The above-described first, second, third, and fourth objects are attained by an oxide-superconductor comprising an oxide having a $K_2NiF_4$ crystalline structure similar to a perovskite crystalline structure and represented by the following formula:

$$(Ba_xSr_zLa_{1-x-z})_2Cu_{1-w}Ag_wO_{4(1-y)}$$

wherein $0.1 < x+z < 0.3$ and $w=0$; or $0 \leq x < 1$, $0 \leq z < 1$, $0 < w < 1$, and $y \leq 0$.

$BaPb_{1-x}Bi_xO_3$ which is a known material has a critical temperature, $T_c$, of 10 K. According to the Bardeen-Cooper-Schrieffer (abbreviated to "BCS") theory, the critical temperature, $T_c$, of the superconducting material has the following relationship:

$$T_c = 1.14 \langle H \rangle_D \exp[-1/N(0)V]$$

wherein $\langle H \rangle_D$ is Debye temperature, $N(0)$ the electron density of state, and V the electron-phonon interaction. The reason why the superconductor has a high critical temperature resides in that since the Bi atom takes a mixed valance of 3 and 5, the oxygen octahedron of the perovskite crystalline structure is repeatedly expanded and shrunk, which causes a strong mutual action between the phonon vibration mode and the electrons. However, since the conductive electron of $BaPb_{1-x}Bi_xO_3$ is an sp electron comprising a 6S band of (Pb,Bi) and a 2p band of O, the electron density of state, $N(0)$, of the Fermi-surface is small. This is an unfavorable factor for attaining a high critical temperature.

Therefore, a superconductor having a strong electron-phonon interaction, a high electron density of state, $N(0)$, and a high critical temperature can be realized by the use of an element which takes a mixed valence and in which the conduction electron is a d electron when the valence is $+2$.

The above-described phonon vibration including the expansion and shrinkage of the oxygen octahedron, i.e., critical temperature, is related to a relative size of A ion radius and B ion radius of an $ABO_3$ perovskite crystalline structure. FIG. 1 shows the relationship between the sum of the A ion radius, $R_A$, and the oxygen ion radius, $R_O$, and the sum of the B ion radius, $R_B$, and the oxygen ion radius, $R_O$. FIG. 2 shows the relationship between the ratio of the sum of the A ion radius, $R_A$, and the oxygen ion radius, $R_O$, to the sum of the B ion radius, $R_B$, and the oxygen ion radius, $R_O$, and the ionization energy of the B atom. $BaTiO_3$ is an isolator, and the critical temperatures, $T_c$, of $SrTiO_3$, $BaPb_{1-x}Bi_xO_3$, and $Ba_xLa_{5-x}Cu_5O_{5(3-y)}$ are 0.1 K, 10 K, and 35 K, respectively, i.e., higher in the described order. When this fact is taken into consideration, it can be seen from FIGS. 1 and 2 that the critical temperature is increased with an increase in the ratio of the sum of the B ion radius, $R_B$, and the oxygen ion radius, $R_O$, to the sum of the A ion radius, $R_A$, and the oxygen ion radius, $R_O$, and an increase in the ionization energy of the B atom.

Therefore, when the A atom is Ba and Sr, the B atom is La, and the C atom is Cu, i.e., the compound is $(Ba_xSr_zLa_{1-x-z})_2CuO_{4(1-y)}$, $0 < x \leq 0.4$ and $0 < z \leq 0.4$ are available. Particularly, when x is 0.075 and z is 0.005 or x is 0.005 and z is 0.075, the critical temperature is high. Sr has an ion radius smaller than that of Ba, which makes the production of the material easy. When Ba is ionized, it exhibits an effective charge larger than that of Sr and, therefore, can supply a large number of conductive electrons. Therefore, the setting of the X and z values so as to satisfy the relationship $0.1 < x+z < 0.3$ through the mixing of both elements, i.e., Ba and Sr leads to the realization of an oxide-superconductor which has a high critical temperature and can be easily produced.

Further, as can be seen from FIG. 1, the replacement of Cu with Ag for formation of $(Ba_xSr_zLa_{1-x-z})_2Cu_{1-w}Ag_wO_{4(1-y)}$ (wherein $0 \leq x < 1$, $0 \leq z \leq 1$, $0 < w < 1$, and $y \geq 0$) enables an increase in the B ion radius in the $ABO_3$ perovskite crystalline structure, thus realizing a high critical temperature.

The above-described first, second, third, fourth, and fifth objects are attained by the incorporation of at least one third atom selected from among alkali metals, such as Na, K, Rb, and Cs, and F in an oxide-superconductor of $A_3Cu_3O_7$ type (wherein A comprises both of a first atom composed of Ba and a second atom selected from among Y, La, Nd, Sm, Eu, Gd, Dy, Ho, Er, Tm, and Yb) having at least one of a $CuO_6$ octahedron and a $CuO_5$ pentahedron.

The alkali metal is monovalent, and the A site atom, i.e., the atoms other than Cu and O are divalent or trivalent. Therefore, the replacement of the A site atoms with an alkali metal brings about a decrease in the number of the carriers when the carrier is an electron and an increase in the number of the carriers when the carrier is a positive hole. In either case, such replacement causes the change in the number of the carriers, which makes it possible to freely change the position of the Fermi-surface through change in the degree of the replacement. This in turn makes it possible to maximize the electron density of state, $N(0)$, of the Fermi-surface, thus enabling an increase in the superconducting critical temperature, $T_c$, according to the BCS theory.

In an oxide-superconductor characterized by possessing a $K_2NiF_4$ structure or an oxygen-deficient perovskite structure or a structure similar to them and having a $CuO_6$ octahedron or a $CuO_5$ pentahedron, there exists places where $CuO_6$ octahedra which are located along the c-axis and adjacent to each other are shifted in parallel in the directions of x and y by (a/2, b/2) (wherein a and b are lattice constants in the directions of x and y, respectively). Therefore, the structures of the $CuO_6$ octahedra adjacent to each other can be stabilized by insertion of an alkali metal into such places, i.e., between the lattices. This leads to the realization of an oxide-superconductor which can be easily produced. Further, since the superconducting critical current density depends upon the homogeneity of the material, the realization of such a material which is homogeneous and easy to produce in turn enables the realization of an oxide-superconductor having a high superconducting critical current density.

Since the valences of a halogen and oxygen are $-1$ and $-2$, respectively, the replacement of the oxygen atom with a halogen brings about, in the crystal, an increase in the number of the carriers when the carrier is an electron and a decrease in the number of the carriers when the carrier is a positive hole. The superconducting critical temperature, $T_c$, can be increased by the optimization of the degree of the replacement in the same manner as that described above.

Further, the insertion of a halogen between the lattices exerts the same action as the above-described insertion of an alkali metal between the lattices, which enables the realization of an oxide-superconductor which can be easily produced for the same reason as that described above. Moreover, since the superconducting critical current density depends upon the homogeneity of the material, the realization of such a material which is homogeneous and can be easily produced in turn enables the realization of an oxide-superconductor having a high superconducting critical current density.

The above-described sixth object can be attained by a process for preparing an oxide-superconductor which comprises preparing a starting material composed of at least one member selected from among a polycrystal of an La-M-Cu oxide system or a Y-M-Cu oxide system (wherein M is Sr, Ba or Ca) which is a composite oxide of a $K_2NiF_4$ crystalline structure or a perovskite-like crystalline structure having a copper ion in the body center of the oxygen octahedron and a mixture having a stoichiometric composition ratio similar to that of the constituent elements of said composite oxide and a flux comprised of CuO having a melting point lower than that of said composite oxide, dissolving said starting material in said flux while maintaining the dissolution temperature at a temperature which is lower than the melting point of said composite oxide and causes said composite oxide to be dissolved in said flux, and growing a single crystal of said composite oxide from the resulting saturated flux solution prepared by dissolution of said starting material. That is, in the process of the present invention, a single crystal of a composite oxide $M_2CuO_4$ having a high quality and an appropriate size can be produced at a temperature for lower than that in the case of a direct melting method of a composite oxide (1026° to 1300° C.) by adopting the flux method in which a constituent oxide having a melting point lower than that of the composite oxide, i.e., CuO (melting point: about 1026° C.) or a mixture thereof with $Cu_2O$ (melting point: about 1235° C.) is used as a flux.

The fundamental principle of the process of the present invention will be now described.

The size of the single crystal for use as electrically conductive materials varies according to applications. When the single crystal is used as a superconductive electrode or superconductive wiring, the formation of a thin plate crystal of several millimeters square or a thin film crystal on an insulting board is preferred. On the other hand, when the single crystal is used as an electron emitting material, a size of 1 mm square × 8 mm in length is sufficient for use as a cathode tip although a thin plate crystal of several millimeters square may be used.

In the present invention, a constituent oxide having a melting point lower than that of the composite oxide of an La-M-Cu oxide system or a Y-M-Cu oxide system (wherein M is Sr, Ba or Ca), i.e., CuO (melting point: about 1026° C.) or a mixture thereof with $Cu_2O$ (melting point: about 1235° C.) is used as a flux (solvent), and a single crystal of the composite system of an La-M-cu oxide system or a Y-M-Cu oxide system is crystallized from a supersaturated solution of the composite oxide. The flux may be those satisfying the following requirements.

(1) It has a melting point lower than that of a composite oxide of an La-M-Cu oxide system or a Y-M-Cu oxide system (wherein M is Sr, Ba or Ca).

(2) It is an oxide having the lowest melting point among the constituent oxides of the composite oxide and can completely dissolve the composite oxide in a molten state but has no solubility or a limitation on the solubility in a solid state.

(3) It is available at a low price and free from the occurrence of environmental pollution.

(4) It can be easily removed by dissolution in a dilute acid or alkali or hot water in which the composite oxide to be crystallized is hardly dissolved. Examples of the flux satisfying the above-mentioned requirements include CuO (melting point: about 1026° C.) which is a constituent oxide or a mixture thereof with $Cu_2O$ (melting point: about 1235° C.).

For example, a polycrystal of a composite oxide of an La-M-Cu oxide system or a Y-M-Cu oxide system (wherein M is Sr, Ba or Ca) to be crystallized or a mixed oxide having a stoichiometric composition ratio similar to that of the composite oxide which comprises the constituent oxides or carbonates, e.g., a mixture of $La_2O_3$, MO and CuO or a mixture of $Y_2O_3$, MO and CuO, is dissolved in the above-described flux. The resulting flux solution is maintained at a temperature lower than the melting point of the composite oxide of an La-M-Cu oxide system or a Y-M-Cu oxide system (wherein M is Sr, Ba or Ca) to prepare a saturated flux solution. A single crystal of the composite oxide of an La-M-Cu oxide system or a Y-M-Cu oxide system (wherein M is Sr, Ba or Ca) is crystallized from the saturated flux solution. The crystallization may be conducted by the two following methods. One of the methods comprises lowering the temperature of the supersaturated solution maintained at the above-described temperature at a cooling rate substantially corresponding to a crystal growth rate slightly higher than the generation speed of the single crystal of the composite oxide of an La-M-Cu oxide system or a Y-M-Cu oxide system (wherein M is Sr, Ba or Ca). This method enables the crystallization of a relatively large single crystal of the composite oxide of an La-M-Cu oxide system or a Y-M-Cu oxide system (wherein M is Sr, Ba or Ca) from the above-described saturated flux solution. Further, a polycrystal and a single crystal each having an appropriate size and a high quality can be simultaneously obtained by controlling the single crystal generation speed and the crystal growth rate through the control of the cooling initiation temperature and the cooling rate. The other method comprises immersing a substrate in a supersaturated flux solution maintained at a constant temperature which is by about 10° C. lower than the temperature at which the above-described saturated flux solution is maintained and rotating the substrate, thereby forming a relatively thick single crystal thin film of an La-M-Cu oxide system or a Y-M-Cu oxide system (wherein M is Sr, Ba or Ca) on the substrate through epitaxial growth.

The above-described production of a composite oxide-based electrically conductive material by making use of a flux is advantageous over the conventional melting method in that a single crystal and a crystalline thin film having a size suitable for use as an electrically conductive material can be obtained and that a high-quality crystal substantially free from the disorder of crystal lattices and internal strain can be obtained because the crystallization is conducted at a temperature lower than the melting point (about 1400° C.) of the composite oxide of an La-M-Cu oxide system or a Y-M-Cu oxide system (wherein M is Sr, Ba or Ca). Therefore, fine fabrication by means of patterning can also be very easily conducted by virtue of these advantages. Further, the ion implantation of impurities, such as argon, boron or hydrogen, on the surface of the high-quality crystal at intervals of about 10 nm which substantially corresponds to the size of a vortex contributes to an enhancement in the pinning effect of magnetic flux, which enables an increase in the current which can be flowed through a superconductor.

DETAILED DESCRIPTION OF THE PREFERRED EMBODIMENTS

EXAMPLE 1

Figure 1:
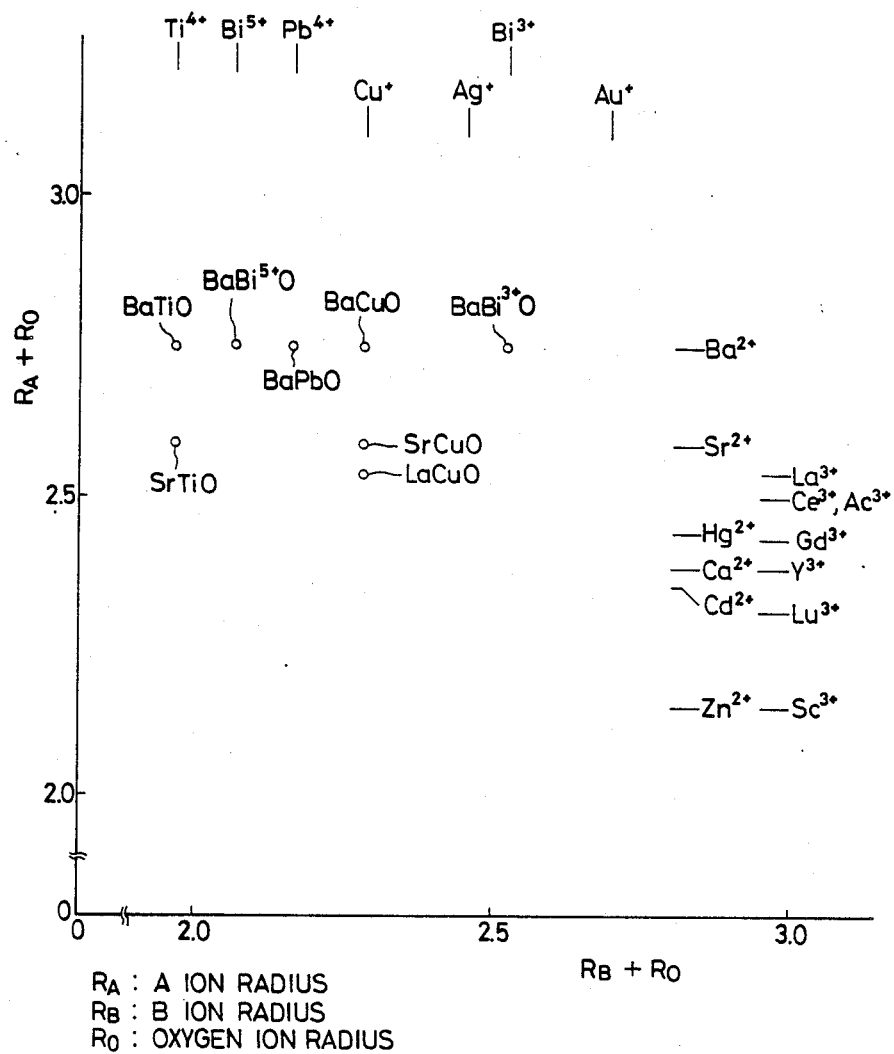
FIG. 1 is a graph showing the relationship between the sum of the A ion radius and the oxygen ion radius and the sum of the B ion radius and the oxygen ion radius of an oxide having an $ABO_3$ perovskite crystalline structure.
Figure 2:
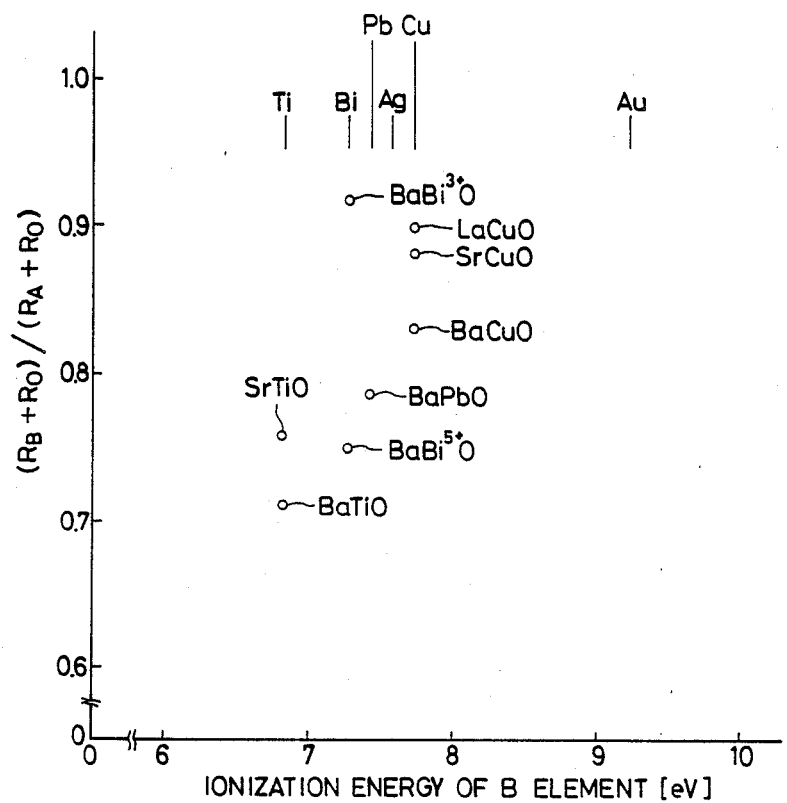
FIG. 2 is a graph showing the relationship between the ratio of the sum of the B ion radius and the oxygen ion radius to the sum of the A ion radius and the oxygen ion radius and the ionization energy of the B atom of an oxide having an $ABO_3$ perovskite crystalline structure.

Process for preparing $Ba_{0.1}Sr_{0.1}La_{1.8}CuO_{4(1-y)}$ (wherein $y \geq 0$):

1.9735 g of $BaCO_3$ having a purity of 99% was mixed with 1.4763 g of $SrCO_3$ having a purity of 99%, 29.3256 g of $La_2O_3$ having a purity of 99.99%, and 24.1600 g of $Cu(NO_3)_2 \cdot 3H_2O$ having a purity of 99.3%. The resulting mixture was dissolved in nitric acid while heating the nitric acid. A suitable amount of ammonia water was added to the solution thus prepared, and oxalic acid was added thereto as a precipitating agent while adjusting the pH value of the solution, thereby coprecipitating $Ba^{2+}$, $Sr^{2+}$, $La^{3+}$, and $Cu^{2+}$. The precipitates were sufficiently washed with water, and the resulting supernatant fluid was discarded. The residue was dried and used as a starting material for heat treatment. After drying, the starting material was heat-treated in an oxygen atmosphere of 1 atm at 1050° C. for 5 hr by making use of a Pt-crucible in a quartz tube with an electric furnace, thereby obtaining $Ba_{0.1}Sr_{0.1}La_{1.8}CuO_{4(1-y)}$.

The oxide-superconductors having the following compositions besides the above composition could be produced in the same manner as that described above:

$Ba_{0.02}Sr_{0.1}La_{1.88}CuO_{4(1-y)}$
$Ba_{0.02}Sr_{0.15}La_{1.83}CuO_{4(1-y)}$
$Ba_{0.05}Sr_{0.1}La_{1.85}CuO_{4(1-y)}$
$Ba_{0.075}Sr_{0.1}La_{1.825}CuO_{4(1-y)}$

EXAMPLE 2

Process for preparing $Ba_{0.05}Sr_{0.075}La_{1.875}Cu_{0.7}Ag_{0.3}O_{4(1-y)}$ (wherein $y \geq 0$):

0.9868 g of $BaCO_3$ having a purity of 99% was mixed with 1.1072 g of $SrCO_3$ having a purity of 99%, 30.5475 g of $La_2O_3$ having a purity of 99.99%, 16.9120 g of $Cu(NO_3)_2 \cdot 3H_2O$ having a purity of 99.3%, and 3.4761 g of $Ag_2O$ having a purity of 99.9%. The resulting mixture was dissolved in nitric acid while heating the nitric acid. A suitable amount of ammonia water was added to the solution thus prepared, and oxalic acid was added thereto as a precipitating agent while adjusting the pH value of the solution, thereby coprecipitating $Ba^{2+}$, $Sr^{2+}$, $La^{3+}$, $Cu^{2+}$, and $Ag^+$. The precipitates were sufficiently washed with water, and the resulting supernatant fluid was discarded. The residue was dried and used as a starting material for heat treatment. After drying, the starting material was heat-treated in an oxygen atmosphere of 1 atm at 1050°C. for 5 hr by making use of a Pt-crucible in a quartz tube with an electric furnace, thereby obtaining $Ba_{0.05}Sr_{0.075}La_{1.875}Cu_{0.7}Ag_{0.3}O_{4(1-y)}$.

EXAMPLE 3

In this example, the process for preparing $(Y_{0.3}Ba_{0.65}K_{0.05})CuO_3$ will be described.

Distilled water was added to 3.3872 g of $Y_2O_3$ having a purity of 99.99%, 12.8278 g of $BaCO_3$ having a purity of 99%, 0.3455 g of $K_2CO_3$ having a purity of 99%, and 7.9545 g of CuO having a purity of 99.99%, followed by sufficient wet milling in a ball mill for 24 hr. After drying, the resulting mixture was heat-treated in an oxygen atmosphere of 1 atm at 850° C. for 10 hr by making use of a Pt-crucible in an electric furnace. Thereafter, the heat-treated mixture was sufficiently ground in an agate mortar. The resulting powder was again heat-treated in an oxygen atmosphere of 1 atm at 850° C. for 10 hr. The heat-treated powder was again sufficiently ground in an agate mortar. The resulting material was pressed at a pressure of 5 ton/cm$^2$, thereby molding it into a disk. The disk was heat treated in an oxygen atmosphere of 1 atm at 1000° C. for 10 hr, thereby obtaining $(Y_{0.3}Ba_{0.65}K_{0.05})CuO_3$. The oxide-superconductors as shown in the following Table 1 could be obtained in the same manner as that described above, except that the amounts of the starting materials were varied.

TABLE 1

| starting material | produced material |
| --- | --- |
| $Y_2O_3$, $BaCO_3$, $K_2CO_3$, CuO | $(Y_{0.4}Ba_{0.55}K_{0.05})CuO_3$ |
| $Y_2O_3$, $BaCO_3$, $K_2CO_3$, CuO | $(Y_{0.4}Ba_{0.6})K_{0.05}CuO_3$ |
| $Y_2O_3$, $BaCO_3$, $Na_2CO_3$, CuO | $(Y_{0.4}Ba_{0.6}Na_{0.05})CuO_3$ |
| $Y_2O_3$, $BaCO_3$, $Rb_2CO_3$, CuO | $(Y_{0.4}Ba_{0.5}Rb_{0.1})CuO_3$ |
| $Y_2O_3$, $BaCO_3$, $Cs_2CO_3$, CuO | $(Y_{0.4}Ba_{0.5}Cs_{0.1})CuO_3$ |

EXAMPLE 4

In this example, the process for preparing $(Y_{0.85}Ba_{0.1}Rb_{0.05})CuO_3$ will be described. Distilled water was added to 9.59693 g of $Y_2O_3$ having a purity of 99.99%, 1.97339 g of $BaCO_3$ having a purity of 99%, 0.57736 g of $Rb_2CO_3$ having a purity of 99%, and 7.95454 g of CuO having a purity of 99.99%, followed by sufficient wet milling in a ball mill for 24 hr. After drying, the resulting mixture was heat-treated in an oxygen atmosphere of 1 atm at 850° C. for 10 hr by making use of a Pt-crucible in an electric furnace. Thereafter, the heat-treated mixture was sufficiently ground in an agate mortar. The resulting powder was again heat-treated in an oxygen atmosphere of 1 atm at 850° C. for 10 hr. The heat-treated powder was again sufficiently ground in an agate mortar. The resulting material was pressed at a pressure of 5 ton/cm$^2$, thereby molding it into a disk. The disk was hot-pressed under the following conditions: an oxygen atmosphere of 1 atm, a temperature elevation-lowering rate of 200° C./hr, a retention temperature of 1000° C., a retention time of 10 hr, and a pressure of 300 bar. Thus, $(Y_{0.85}Ba_{0.1}Rb_{0.05})CuO_3$ was obtained. The oxide-superconductors as shown in the following Table 2 could be obtained in the same manner as that described above, except that the amounts of the starting materials were varied.

TABLE 2

| starting material | produced material |
| --- | --- |
| $Y_2O_3$, $BaCO_3$, $K_2CO_3$, CuO | $(Y_{0.4}Ba_{0.3}K_{0.3})CuO_3$ |
| $Y_2O_3$, $BaCO_3$, $K_2CO_3$, CuO | $(Y_{0.55}Ba_{0.3}K_{0.15})Cu_2O_7$ or $Y_{0.275}Ba_{0.15}K_{0.075}CuO_{3.5}$ |
| $Y_2O_3$, $BaCO_3$, $K_2CO_3$, CuO | $(YBa_2)KCu_3O_7$ |

EXAMPLE 5

In this example, the process for preparing a $(Y_{0.3}Ba_{0.3}K_{0.4})CuO_3$ thin film will be described.

A disk-shaped polycrystal obtained in Example 3 was used as a target for sputtering. Sapphire or $SrTiO_3$ was used as a substrate. The substrate temperature was selected from temperatures ranging from room temperature to 500° C. The sputtering was conducted in a mixed gas atmosphere comprising argon and oxygen (partial pressure of oxygen: 5% or less) at an rf voltage of 1 to 4 kV, thereby obtaining $(Y_{0.3}Ba_{0.3}K_{0.4})CuO_3$ having a film thickness of 3000 to 7000 Å. It is needless to say that the film of the oxide-superconductors as described in Example 3 or 4 can be obtained in the same manner as that described above.

The results on the measurement of the critical temperature, $T_c$, of the materials thus obtained will now be described. The measurement was conducted according to a commonly accepted four-terminal electric resistivity measuring method. Specifically, a current having a constant current density of a few A/cm$^2$ was allowed to flow at both ends of a sample, followed by measurement of the resistivity which changed when the oxide-superconductor was shifted from a superconductive state to a normal conductive state. A RoseInnes cryostat which takes advantage of low-temperature gas adsorption characteristics of active carbon was used, and the temperature elevation rate was adjusted to 0.3 K/min. An Au·Fe-chromel thermocouple was used as a heat sensitive element.

Figure 3:
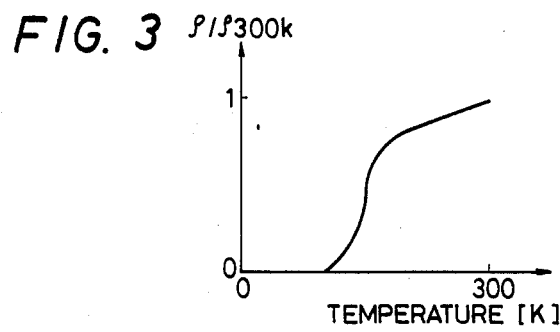
FIG. 3 is a graph showing the results of the determination on the change in the resistivity of $(Y_{0.3}Ba_{0.65}K_{0.05})CuO_3$ with the change in the temperature.

FIG. 3 is a graph showing the results of the determination on the resistivity of $(Y_{0.3}Ba_{0.65}K_{0.05})CuO_3$ prepared in Example 3.

Figure 4:
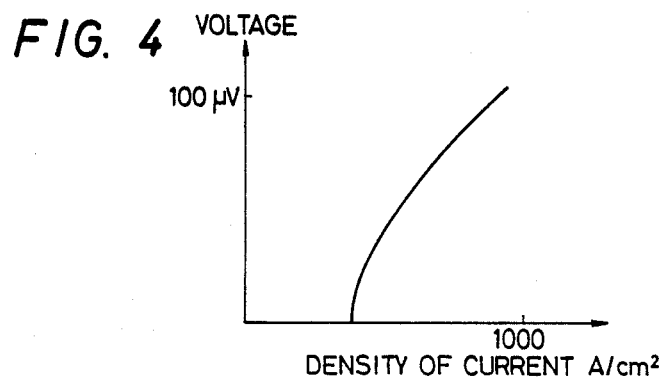
FIG. 4 is a graph showing the results of the determination on the current-voltage characteristics of $(Y_{0.55}Ba_{0.3}K_{0.15})_3Cu_2O_7$ or $Y_{0.275}Ba_{0.15}K_{0.075}CuO_{3.5}$ at a liquid helium temperature.

FIG. 4 is a graph showing the results of the determination on the current-voltage characteristics at a liquid helium temperature of $(Y_{0.55}Ba_{0.3}K_{0.15})_3Cu_2O_7$ or $Y_{0.275}Ba_{0.15}K_{0.075}CuO_{3.5}$ prepared in Example 4.

Figure 5:
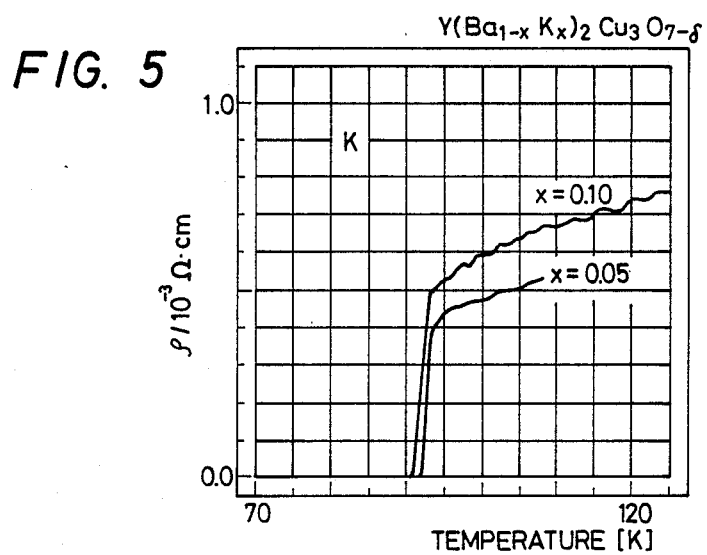
FIG. 5 is a graph showing the results of the determination on the change in the resistivity of $Y(Ba_{1-x}K_x)_2Cu_3O_{7-\delta}$ (wherein x is 0.10 and 0.05) with the change in the temperature.
Figure 6:
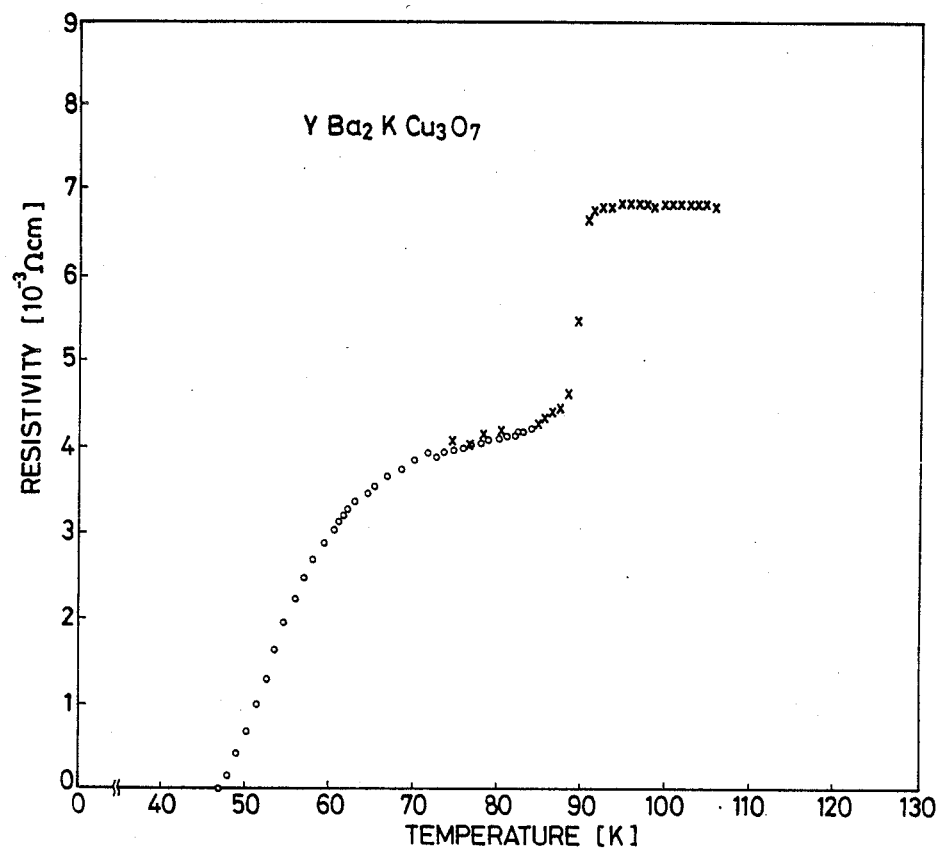
FIG. 6 is a graph showing the results of the determination on the change in the resistivity of $YBa_2KCu_3O_7$ with the change in the temperature.
Figure 7:
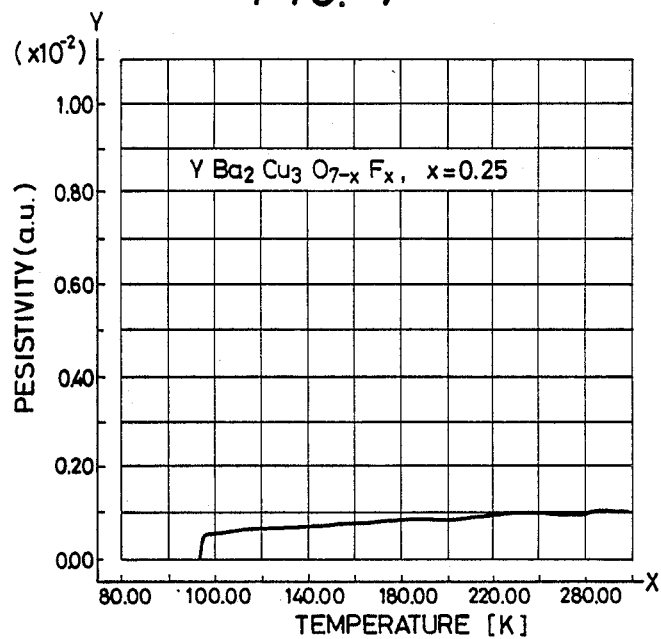
FIG. 7 is a graph showing the results of the determination on the change in the resistivity of $YBa_2Cu_3O_{7-x}F_x$ (wherein x is 0.25) with the change in the temperature.
Figure 8:
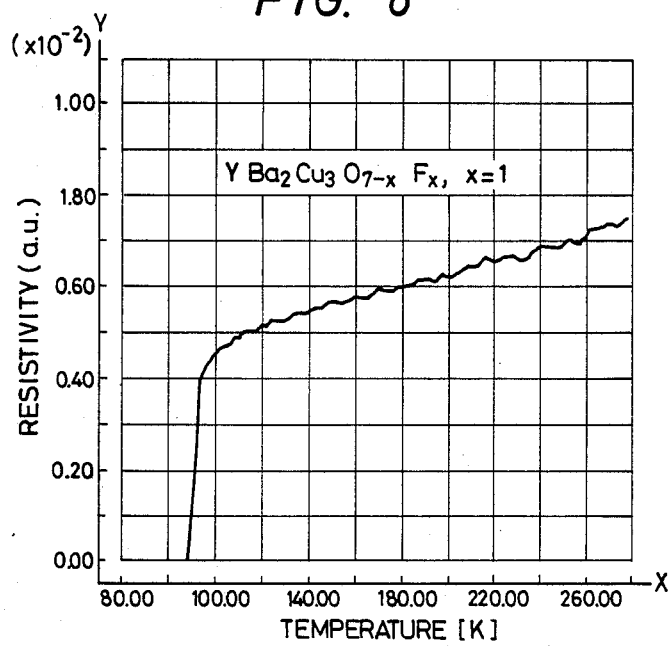
FIG. 8 is a graph showing the results of the determination on the change in the resistivity of $YBa_2Cu_3O_{7-x}F_x$ (wherein x is 1.0) with the change in the temperature.

The same results as those described above were obtained with respect to the other materials of the present invention. The results of the determination of the change in the resistivity with the change in the temperature with respect to these materials are shown in FIGS. 5 to 8. Specifically, FIG. 5 shows the results of the determination on the change in the resistivity of $Y(Ba_{1-x}K_x)_2Cu_3O_{7-\delta}$ (wherein $x=0.10, 0.05$) with the change in the temperature, FIG. 6 the results of the determination on the change in the resistivity of $YBa_2KCu_3O_7$ with the change in the temperature, FIG. 7 the results of the determination on the change in the resistivity of $YBa_2Cu_3O_{7-x}$ (wherein $x=0.25$) with the change in the temperature, and FIG. 8 the results of the determination on the change in the resistivity of $YBa_2Cu_3O_{7-x}F_x$ (wherein $x=1$) with the change in the temperature.

As described above, the present invention enables the number of the carriers to be changed, which not only makes it possible to maximize the electron density of state in the Fermi-surface but also contributes to the stabilization of the structure. This leads to the realization of an oxide-superconductor which can be easily produced and has a high critical current density.

Figure 9:
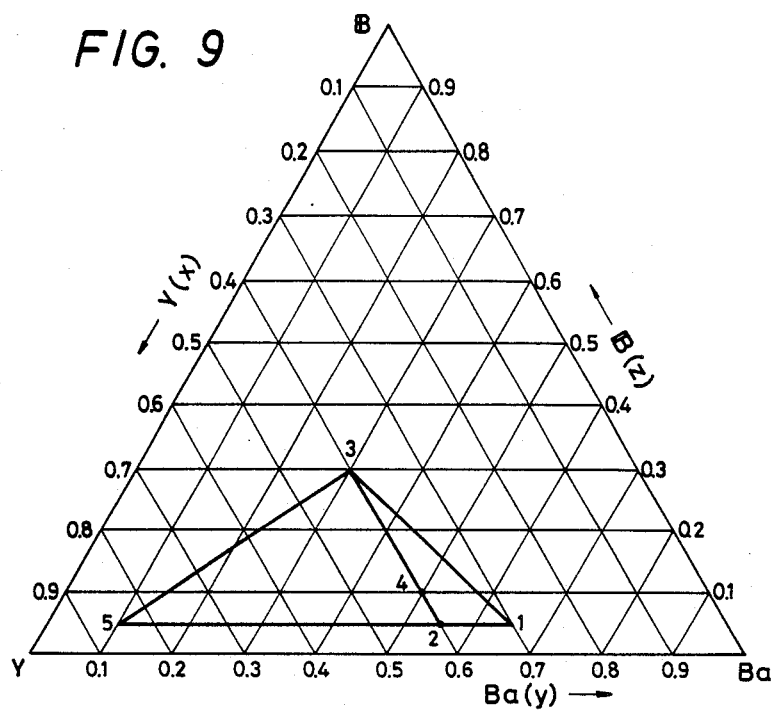
FIG. 9 is a diagram showing the composition ratio of an oxide represented by the chemical formula $Y_xBa_yB_zCuO_{3-y}$ (wherein $x+y+z=1$ and B is Na, K, Rb or Cs)

The composition ratio x:y:z of an oxide represented by the chemical formula $Y_xBa_yB_zCuO_{3-\delta}$ (wherein $x+y+z=1$ and B is Na, K, Rb or Cs) is shown in FIG. 9. Points 1, 2, 3, 4, and 5 respectively correspond to $Y_{0.3}Ba_{0.65}K_{0.05}CuO_{3-\delta}$, $Y_{0.4}Ba_{0.55}K_{0.05}CuO_{3-\delta}$, $Y_{0.4}Ba_{0.3}K_{0.3}CuO_{3-\delta}$, $Y_{0.4}Ba_{0.5}Rb_{0.1}CuO_{3-\delta}$, and $Y_{0.85}Ba_{0.1}Rb_{0.05}CuO_{3-\delta}$ as described in the above examples. In FIG. 9, the selection of the coordinate values within a triangle of which the vertexes are points 1, 3, and 5 for the composition ratio x:y:z of an oxide represented by the above-described chemical formula leads to the realization of an oxide-superconductor which can be easily produced. Particularly, in FIG. 9, the selection of the coordinate values within a triangle of which the vertexes are points 1, 2, and 3 for the composition ratio x:y:z of an oxide represented by the above-described chemical formula leads to the realization of an oxide-superconductor which has increased denseness and can be easily produced.

The increase in the denseness contributes to a remarkable improvement in the critical current density. Particularly, when B is K, the denseness of the produced oxide-superconductor of a Y-Ba-K-Cu oxide system is high, which contributes to the realization of a high superconducting current density.

EXAMPLE 6

The examples of the process for preparing an oxide-superconductor according to the present invention will now be described.

At the outset, some description will be given with respect to a composite oxide of an La-M-cu oxide system (wherein M is Sr, Ba or Ca) having a $K_2NiF_4$ crystalline structure in which a copper ion is contained in the body center of the oxygen octahedron.

The present example relates to a process for preparing a single crystal in which a $(La_{1-x}M_x)_2CuO_4$ sinter (wherein M is Sr, Ba or Ca) and copper oxide ($Cu_2O\cdot 2CuO$) are used as the starting material and the flux, respectively.

In the present example, as a representative example of the composite oxide, a composite oxide in which M is Sr will be described.

About 2 g of a mass of a starting material comprising a $(La_{0.9}Sr_{0.1})_2CuO_4$ sinter and a flux comprising about 1.47 g of $Cu_2O$ and about 1.63 g of CuO were placed in a Pt-crucible and maintained at 1300° C. to 1100° C. in the air for a sufficient period of time, thereby forming a saturated copper oxide flux solution containing $(La_{0.9}Sr_{0.1})$ therein. Thereafter, the temperature of the saturated solution was lowered at a cooling rate of 3 to 70° C./hr to prepare solid copper oxide.

A single crystal generation speed was determined from the number of the $(La_{0.9}Sr_{0.1})_2CuO_4$ crystals in a saturated solution of a certain temperature. Further, the crystal growth rate was estimated from the size of the formed single crystal.

The highest temperature of the electric furnace used in this example was 1500° C. The crystal thus obtained was identified by the powder X ray diffraction or Laue diffraction method.

The $(La_{0.9}Sr_{0.1})_2CuO_4$ sinter used as the starting material was one prepared by a reaction represented by the following reaction formula:

$0.9La_2O_3 + 0.2SrCO_3 + CuO + 0.05O_2 = (La_{0.9}Sr_{0.1})_2CuO_4 + 0.2CO_2$ under the following reaction conditions: calcination in the air at 750° C. for 5 hr and baking in the air at 1200° C. for 5 hr.

Then, in the above example, when the cooling initiation temperature was 1240° C., the Pt-crucible was maintained for 5 hr in such a state that the $(La_{0.9}Sr_{0.1})_2CuO_4$ sinter could be sufficiently dissolved in the molten copper oxide in the Pt-crucible, followed by cooling to room temperature at a cooling rate of 3° C./hr. The $(La_{0.9}Sr_{0.1})_2CuO_4$ sinter remained on the bottom of the Pt-crucible without dissolving in the molten copper oxide. However, there were observed a number of conductive $(La_{0.9}Sr_{0.1})_2CuO_4$ single crystals glowing with black on the central portion of the Pt-crucible. The crystal had a square shape having a size of about 5 mm square. When the rate of cooling from 1300° C. was decreased to less than 70° C./hr, a single crystal was obtained. When the cooling rate was decreased to less than 30° C./hr, a relatively large crystal could be obtained although the number of the single crystals was decreased. When the cooling rate was 3° C./hr, a single crystal having a size of about 8 mm square was obtained. A cooling rate of less than 3° C./hr made the formation of the single crystal unstable. When the cooling initiation temperature is 1300° C., the oxygen of the copper oxide tends to easily dissociate although the solubility is increased, which makes it difficult to form a high-quality crystal. On the other hand, when the cooling initiation temperature is 1100° C., the size of the formed crystal is very small since the solubility is decreased. In view of the above facts, it is preferred that the cooling initiation temperature and the cooling rate be 1100° to 1300° C. and 3° to 70° C./hr, respectively.

An La-M-Cu oxide system in which M is Ba or Ca can be produced by replacing the above-mentioned Sr with Ba or Ca. That is, the crystal of $(La_{0.9}Ba_{0.1})_2CuO_4$ or $(La_{0.9}Ca_{0.1})_2CuO_4$ can be prepared through the same steps as those in the case of Sr, except that about 2 g of (La, Ba)$_2CuO_4$ or (La, Ca)$_2CuO_4$ is used as the starting material.

EXAMPLE 7

Figure 10:
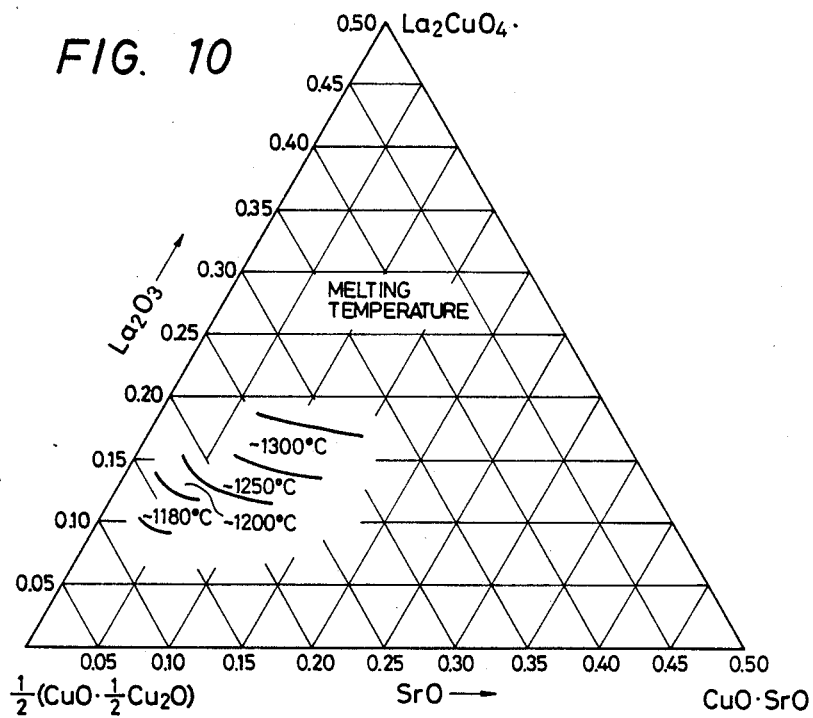
FIG. 10 is a diagram showing the dependence of the melting temperature upon the composition ratio of the starting material.

The present example relates to a process for preparing a single crystal in which the constituent oxides and carbonate of an La-M-Cu oxide system (wherein M is Sr, Ba or Ca) (i.e., $SrCO_3$, $La_2O_3$, CuO or $Cu_2O$) are used as the starting materials. About 0.62 g of $SrCO_3$, about 6.20 g of $La_2O_3$, about 4.93 g of CuO, and about 4.43 g of $Cu_2O$ as the starting materials were weighed and placed in a Pt-crucible. Since the flux should be composed of the above-described CuO and $Cu_2O$, the CuO and $Cu_2O$ are placed in the crucible in an amount exceeding the stoichiometric composition ratio. For example, assuming that CuO and $Cu_2O$ equally contribute to the formation of a single crystal, about 4.09 g of CuO and about 3.68 g of $Cu_2O$ would serve as the flux. The starting materials were maintained at 1300° to 1100° C. in an oxygen atmosphere for about 8 hr to allow them to sufficiently melt. The dependence of the melting temperature upon the proportions of the starting materials is shown in FIG. 10. Thereafter, the temperature of the flux solution was lowered at a certain cooling rate between 3° C./hr and 70° C./hr, and the solution was then maintained for several hours at a temperature by about 20° C. lower than the temperature at which the starting materials were dissolved. A number of conductive $(La_{0.9}Sr_{0.1})_2CuO_4$ single crystals glowing with black were found on the surface of the flux solution. The crystal had a square shape having a size of about 5 mm square. The crystal thus obtained was identified by the powder X ray diffraction or Laue diffraction method.

When the rate of cooling from 1300° C. was decreased to less than 70° C./hr, a single crystal was obtained. When the cooling rate was decreased to less than 30° C./hr, a relatively large crystal could be obtained although the number of the single crystals was decreased. When the cooling rate was 3° C./hr, a single crystal having a size of about 8 mm square was obtained. A cooling rate of less than 3° C./hr made the formation of the single crystal unstable. When the cooling initiation temperature is 1300° C., the oxygen of the copper oxide tends to easily dissociate although the solubility is increased, which makes it difficult to form a high-quality crystal. On the other hand, when the cooling initiation temperature is 1100° C., the size of the formed crystal is very small since the solubility is decreased. In view of the above facts, it is preferred that the cooling initiation temperature and the cooling rate be 1100° to 1300° C. and 3° to 70° C./hr, respectively.

Figure 11:
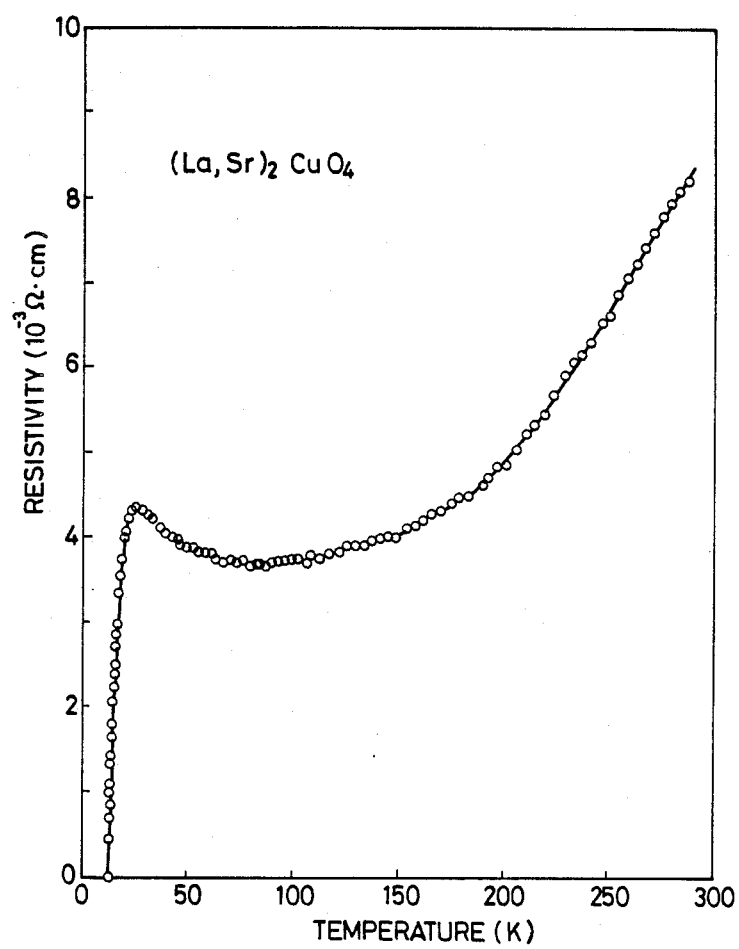
FIG. 11 is a graph showing the results of the determination on the change in the resistivity of $(LaSr)_2CuO_4$ single crystal with the change in the temperature.

FIG. 11 is a graph showing the results of the determination on the change in the resistivity of the $(La,Sr)_2CuO_4$ single crystal obtained in the present example with the change in the temperature.

In the case of an La-Ba-Cu oxide system, a single crystal of $(La_{0.9}Ba_{0.1})_2CuO_3$ can be prepared by making use of about 0.83 g of $BaCO_3$ instead of $SrCO_3$. Similarly, in the case of an La-Ca-Cu oxide system, a single crystal of $(La_{0.9}Ca_{0.1})_2CuO_4$ can be prepared by making use of about 0.42 g of $CaCO_3$.

EXAMPLE 8

The present example relates to a process for preparing a single crystal thin film in which a $(La_{0.9}Sr_{0.1})_2CuO_4$ sinter or a mixed starting material comprising the following composition is used as the starting material and a copper oxide comprising $2CuO \cdot Cu_2O$ is used as the flux:

1.475 g of $Cu_2O$;
1.640 g of CuO;
2.0615 of $La_2O_3$; and
0.2076 g of $SrCO_3$.

About 10 g of a mass of a starting material comprising a $(La_{0.9}Sr_{0.1})_2CuO_4$ sinter and a flux comprising about 7.35 g of $Cu_2O$ and about 8.05 g of CuO were placed in a Pt-crucible. Alternatively, the constituent oxides of the above-described La-Sr-Cu oxide system, i.e., $Cu_2O$, CuO, $La_2O_3$, and $SrCO_3$ were placed in a Pt crucible. In this case as well, when the same assumption as that in Example 7 is made, about 1.081 g of CuO and about 0.972 of $Cu_2O$ would serve as the flux. They were maintained at 1300° to 1100° C. in the air for a sufficient period of time to prepare a copper oxide flux saturated solution containing $(La_{0.9}Sr_{0.1})_2CuO_4$. Thereafter, an $SrTiO_3$ substrate (melting point: 1900° C.) comprising a single crystal of a (100) face having a size of 5 mm square is put in a supersaturated flux solution maintained at a temperature by about 10° C. lower than the temperature of the saturated solution. A conductive $(La_{0.9}Sr_{0.1})_2CuO_4$ single crystal thin film glowing with black was crystallized on the substrate while rotating the substrate. It was found from the etch pit test that a high quality crystal film substantially free from defect could be obtained by making use of the $SrTiO_3$ substrate because the lattice constant, $a_0$, of the $SrTiO_3$ substrate is 3.904 Å, i.e., is close to the lattice constant of $(La_{0.9}Sr_{0.1})_2CuO_4$.

Further, it was found that the doping with an impurity of a peak value of $10^{19}$ Ar atom/cm$^2$ at a position corresponding to a depth of 0.1 μm on the surface of a single crystal by a 100 KeV-ion implantation contributed to an improvement in the superconducting critical current.

Substantially the same results as those described above were obtained when $(La, Ba)_2CuO_4$ or $(La, Ca)_2CuO_4$ sinter powder was used as the starting material.

EXAMPLE 9

A process for preparing a composite oxide of a Y-M-Cu oxide system (wherein M is Sr, Ba or Ca) having a perovskite-like crystalline structure in which a copper ion is contained in the body center of the oxygen octahedron will now be described.

The present example relates to a process for preparing a single crystal in which a sinter of a composite oxide of Y-M-Cu oxide system (wherein M is Sr, Ba or Ca) and a copper oxide (CuO) are used as the starting material and the flux, respectively. In the present example, as a representative example of the composite oxide, a composite oxide in which M is Ba will be described.

About 2 g of a mass of a starting material comprising a sinter of a composite oxide of a Y-Ba-Cu oxide system and about 3.15 g of a flux comprising CuO were placed in a Pt-crucible, and maintained at 1100° C. to 1026° C. in an oxygen atmosphere for a sufficient period of time, thereby forming a saturated copper oxide flux solution containing the Y-Ca-Cu oxide system therein. Thereafter, the temperature of the saturated solution was lowered at a cooling rate of 3° to 70° C./hr to prepare solid copper oxide.

The single crystal generation speed and crystal growth rate of the Y-Ba-Cu oxide system were determined in the same manner as that in the case of the La-Sr-Cu oxide system in Example 8.

The highest temperature of the electric furnace used in this example was 1500° C. The crystal thus obtained was identified by the powder X ray diffraction or Laue diffraction method.

The sinter used as the starting material was one prepared by a reaction represented by the following reaction formula:

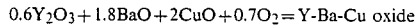

$$0.6Y_2O_3 + 1.8BaO + 2CuO + 0.7O_2 = \text{Y-Ba-Cu oxide}$$

system under the following reaction conditions: calcination in the air at 750° C. for 4 hr and baking in the air at 1000° C. for 5 hr.

When the cooling initiation temperature was 1080° C. in this example, the Pt-crucible was maintained at that temperature for 5 hr so that part of the Y-Ba-Cu oxide system sinter could be dissolved in the molten copper oxide in the Pt-crucible, followed by cooling to room temperature at a cooling rate of 30° C./hr. Consequently, part of the Y-Ba-Cu oxide system sinter remained on the bottom of the Pt-crucible without dissolving in the molten copper oxide. However, there were observed a number of conductive Y-Ba-Cu oxide system single crystals glowing with black on the center portion of the Pt-crucible.

When the rate of cooling from 1100° C. was decreased to less than 70° C./hr, a single crystal was obtained. When the cooling rate was decreased to less than 30° C./hr, a relatively large crystal could be obtained although the number of the single crystals was decreased. When the cooling rate was 3° C./hr, a single crystal having a larger size was obtained. A cooling rate of less than 3° C./hr made the formation of the single crystal unstable. When the cooling initiation temperature is 1100° C., the oxygen of the copper oxide tends to easily dissociate although the solubility is increased, which makes it difficult to form a high-quality crystal. On the other hand, when the cooling initiation temperature is 1030° C., the size of the formed crystal is very small since the solubility is decreased. It was found from the above facts that the cooling initiation temperature and the cooling rate were 1026° to 1100° C. and 3° to 70° C./hr, respectively.

Substantially the same results as those described above were obtained when Y-Sr-Cu oxide system sinter powder or Y-Ca-Cu oxide system sinter powder was used as the starting material.

The present example was described with reference to the case where CuO was used as the flux. When a flux comprising CuO and $Cu_2O$ is used, the same procedures as those of Example 6 may be repeated.

EXAMPLE 10

The present example relates to a process for preparing a single crystal in which constituent oxides and carbonate of the Y-Ba-Cu oxide system (i.e., $BaCO_3$, $Y_2O_3$, and CuO) are used as the starting materials. About 39.772 g of $BaCO_3$, about 5.645 g of $Y_2O_3$, and about 39.470 g of CuO were weighed. They were sufficiently mixed with each other and then placed in a Pt-crucible. In this case, when the same assumption as that in Example 7 is made, about 27.841 g of CuO will serve as the flux. However, in this Y-Ba-Cu oxide system, it is necessary that the half of $BaCO_3$ be added as the flux like CuO. The mixture was maintained in an oxygen atmosphere at a temperature ranging from 1300° to 1100° C. to allow part of these starting materials to melt, thereby preparing a melt-solid mixture.

Thereafter, the saturated solution was gradually cooled to 850° C. at a cooling rate of about 10° C./hr. Consequently, there were observed a number of conductive Y-Ba-Cu-O single crystals glowing with black in the Pt-crucible. The crystal had a plate shape having a size of about 1 mm square and a thickness of about 0.1 mm.

EXAMPLE 11

The present example relates to a process for preparing a single crystal thin film in which a Y-Ca-Cu oxide system sinter or a mixed starting material comprising $Y_2O_3$, BaO, and CuO and a copper oxide comprising CuO are used as the starting material and the flux, respectively.

About 10 g of a mass of a starting material comprising a Y-Ba-Cu oxide system sinter and 15 g of CuO as the flux were weighed and placed in a Pt-crucible, and maintained at 1100° to 1026° C. in the air for a sufficient period of time to prepare a copper oxide flux saturated solution containing the Y-Ba-Cu oxide system. Thereafter, an $SrTiO_3$ substrate (melting point: 1900° C.) comprising a single crystal of a (100) face having a size of 5 mm square were put in a supersaturated flux solution maintained at a temperature by about 10° C. lower than the temperature of the saturated solution. A conductive Y-Ba-Cu oxide system single crystal thin film glowing with black was crystallized on the substrate while rotating the substrate. It was found from the etch pit test that a high-quality crystal film substantially free from defect could be obtained by making use of the $SrTiO_3$ substrate because the lattice constant, $a_0$, of the $SrTiO_3$ substrate is 3.904 Å, i.e., is close to the lattice constant of $(Y_{0.4}Sr_{0.6})_3Cu_2O_7$.

Further, it was found that the doping with an impurity of a peak value of $10^{19}$ Ar atom/$cm^2$ at a position corresponding to a depth of 0.1 μm on the surface of a single crystal by a 100 KeV-ion implantation contributed to an improvement in the superconducting critical current.

Substantially the same results as those described above were obtained when Y-Sr-Cu oxide system or Y-Ca-Cu oxide system sinter powder was used as the starting material.

What is claimed is:

1. A process for preparing an oxide-superconductor which comprises preparing a starting material composed of at least one member selected from among a polycrystal of an La-M-Cu oxide system or a Y-M-Cu oxide system (wherein M is Sr, Ba or Ca) which is a composite oxide of a $K_2NiF_4$ crystalline structure or a perovskite-like crystalline structure having a copper ion in the body center of the oxygen octahedron and a mixture having a stoichiometric composition ratio similar to that of the constituent elements of said composite oxide and a flux comprised of CuO having a melting point lower than that of said composite oxide, dissolving said starting material in said flux while maintaining the dissolution temperature at a value which is lower than the melting point of said composite oxide and causes said composite oxide to be dissolved in said flux, and growing a single crystal of said composite oxide from the resulting saturated flux solution which have been prepared by dissolution of said starting material.

2. A process according to claim 1, wherein said crystal of said composite oxide is grown in said saturated flux solution by gradually cooling said saturated flux solution.

3. A process according to claim 1, wherein said saturated flux solution is maintained at a temperature by about 10° C. lower than said dissolution temperature and a substrate is immersed in said saturated flux solution, followed by rotation of said substrate, thereby growing the crystal of said composite oxide on said substrate.

4. A process according to claim 1, wherein said dissolution temperature is 1026° to 1300° C.

5. A process according to claim 1, wherein said flux further comprises $Cu_2O$.

6. A process according to claim 1, wherein said flux has no solubility or a limitation on the solubility in the form of a solid with respect to said composite oxide.

7. A process according to claim 2, wherein said saturated flux solution is cooled at a cooling rate of 3° to 70° C./hr.

8. A process according to claim 3, wherein said substrate is a $SrTiO_3$ substrate.

9. A process according to claim 4, wherein said dissolution temperature is 1026° to 1100° C.

10. A process according to claim 4, wherein said dissolution temperature is 1100° to 1300° C.

11. A process according to claim 8, wherein said $SrTiO_3$ substrate is comprised of a single crystal of a (100) face.

* * * * *